(12) United States Patent
Yoshikawa et al.

(10) Patent No.: US 9,266,715 B2
(45) Date of Patent: Feb. 23, 2016

(54) SOI WAFER, MANUFACTURING METHOD THEREFOR, AND MEMS DEVICE

(71) Applicants: Eiji Yoshikawa, Tokyo (JP); Jyunichi Ichikawa, Tokyo (JP); Yukihisa Yoshida, Tokyo (JP)

(72) Inventors: Eiji Yoshikawa, Tokyo (JP); Jyunichi Ichikawa, Tokyo (JP); Yukihisa Yoshida, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 72 days.

(21) Appl. No.: 14/193,209

(22) Filed: Feb. 28, 2014

(65) Prior Publication Data

US 2014/0175573 A1 Jun. 26, 2014

Related U.S. Application Data

(62) Division of application No. 13/743,878, filed on Jan. 17, 2013.

(30) Foreign Application Priority Data

Apr. 24, 2012 (JP) ................................. 2012-098447

(51) Int. Cl.
*H01L 21/00* (2006.01)
*B81B 7/00* (2006.01)
*H01L 21/762* (2006.01)
(Continued)

(52) U.S. Cl.
CPC .............. *B81B 7/0038* (2013.01); *B81B 3/0018* (2013.01); *B81C 1/00285* (2013.01); *H01L 21/76259* (2013.01); *H01L 23/26* (2013.01); *H01L 29/16* (2013.01); *H01L 2924/0002* (2013.01)

(58) Field of Classification Search
None
See application file for complete search history.

(56) References Cited

U.S. PATENT DOCUMENTS 5,389,551 A * 2/1995 Kamakura .......... H01L 21/3221
148/DIG. 60
5,946,549 A * 8/1999 Itoigawa ............. B81C 1/00246
257/419

(Continued)

FOREIGN PATENT DOCUMENTS

CN 102243125 A 11/2011
JP 5283712 A 10/1993

(Continued)

OTHER PUBLICATIONS

Communication dated Apr. 14, 2015 from the State Intellectual Property Office of the People's Republic of China in counterpart application No. 201210529923.7.

(Continued)

*Primary Examiner* — Benjamin Sandvik
*Assistant Examiner* — Herve Assouman
(74) *Attorney, Agent, or Firm* — Sughrue Mion, PLLC; Richard C. Turner

(57) ABSTRACT

In order to obtain a SOI wafer having an excellent ability of gettering metal impurities, an efficient method of manufacturing a SOI wafer, and a highly reliable MEMS device using such a SOI wafer, provided is a SOI wafer including: a support wafer (1) and an active layer wafer (6) which are bonded together with an oxide film (3) therebetween, each of the support wafer (1) and the active layer wafer (6) being a silicon wafer; a cavity (1b) formed in a bonding surface of at least one of the silicon wafers; and a gettering material (2) formed on a surface on a side opposite to the bonding surface.

8 Claims, 7 Drawing Sheets

(51) Int. Cl.
    *H01L 29/16*     (2006.01)
    *B81B 3/00*     (2006.01)
    *B81C 1/00*     (2006.01)
    *H01L 23/26*     (2006.01)

(56) References Cited

U.S. PATENT DOCUMENTS

| | | | |
|---|---|---|---|
| 6,912,759 B2 * | 7/2005 | Izadnegahdar | G01L 9/0055 216/56 |
| 7,767,484 B2 * | 8/2010 | Ayazi | B81C 1/00285 257/E21.613 |
| 2008/0318362 A1 * | 12/2008 | Miyazaki | C09G 1/02 438/113 |

FOREIGN PATENT DOCUMENTS

| | | |
|---|---|---|
| JP | 06-036980 A | 2/1994 |
| JP | 09-326396 A | 12/1997 |
| JP | 2001-127274 A | 5/2001 |
| JP | 2008-028244 A | 2/2008 |
| JP | 2011164057 A | 8/2011 |
| WO | 0047969 A1 | 8/2000 |
| WO | 2007/072624 A1 | 6/2007 |

OTHER PUBLICATIONS

Japanese Office Action (Preliminary Notice of Reasons for Rejection) mailed Dec. 3, 2013, Application No. 2012-098447.
Communication dated Aug. 25, 2015 from the Japanese Patent Office in counterpart application No. 2012098447.

* cited by examiner

FIG.4

RESULT OF ANALYSIS OF METAL IMPURITIES
IN SUPPORT WAFER HAVING CAVITY FORMED THEREIN

UNIT ×$10^{10}$ (atoms/$cm^2$)

|  | Na | Ni | Cu | Fe |
|---|---|---|---|---|
| OUTERMOST SURFACE | 1.1 | 0.07 | 0.032 | 0.075 |
| FROM OUTERMOST SURFACE TO DEPTH OF 1 μm | 1 | 0.25 | 5.7 | 0.24 |
| FROM DEPTH OF 1 μm TO DEPTH OF 2 μm | 0.15 | 0.22 | 0.61 | 0.24 |
| FROM DEPTH OF 2 μm TO DEPTH OF 3 μm | 0.18 | 0.24 | 0.28 | 0.24 |
| LIMIT OF QUANTITATION | 0.03 | 0.08 | 0.03 | 0.08 |

FIG.5

RESULT OF ANALYSIS OF METAL IMPURITIES
IN SOI WAFER HAVING CAVITY FORMED THEREIN

UNIT ×$10^{10}$ (atoms/cm$^2$)

|  | Na | Ni | Cu |
|---|---|---|---|
| FROM OUTERMOST SURFACE TO DEPTH OF 8 μm | - | 0.46 | - |
| FROM DEPTH OF 8 μm TO DEPTH OF 12 μm | 1.2 | 66 | 4.1 |
| LIMIT OF QUANTITATION | 0.8 | 0.3 | 0.3 |

"-" MEANS "LESS THAN LIMIT OF QUANTITATION"

SOI WAFER, MANUFACTURING METHOD THEREFOR, AND MEMS DEVICE

CROSS-REFERENCE TO RELATED APPLICATION

This application is a divisional of U.S. application Ser. No. 13/743,878 filed Jan. 17, 2013 which is the disclosure of which is incorporated herein by reference in its entirety.

BACKGROUND OF THE INVENTION

1. Field of the Invention

The present invention relates to a SOI wafer, a manufacturing method therefor, and a MEMS device using a SOI wafer.

2. Description of the Related Art

A silicon on insulator (SOI) wafer in which a silicon layer is provided on a silicon wafer via an intermediate insulating film is excellent in element isolation, and has advantages of being able to reduce parasitic capacitance between an element and the wafer, and in addition, of being able to form a three-dimensional structure. Therefore, a SOI wafer is suitable for a hybrid integrated circuit in which a plurality of kinds of elements such as a bipolar element, a MOS element, and a power element are mounted on one chip, or a high pressure resistant integrated circuit.

Further, a cavity SOI wafer having a cavity therein is also suitable for application to an integrated MEMS device in which a hybrid integrated circuit and micro electro mechanical systems (MEMS) are merged.

As a method of manufacturing a SOI wafer, the following method is known (see, for example, Japanese Patent Application Laid-open No. 2001-44398). In the method disclosed in Japanese Patent Application Laid-open No. 2001-44398, first, there are prepared a support wafer having one mirror polished surface and an active layer wafer having one mirror polished surface. Then, an oxide film of a predetermined thickness is formed on a surface, in particular, on the mirror surface side, of the support wafer.

Then, the mirror surface of the support wafer having the oxide film formed thereon is bonded, as a bonding surface, to the mirror surface of the active layer wafer. After the bonding, in order to reinforce the bonding power, bonding reinforcing heat treatment is carried out. After that, by grinding and polishing a part of the active layer wafer, a SOI wafer having a SOI layer of a predetermined thickness may be obtained.

In regards to a method of manufacturing a cavity SOI wafer suitable for a MEMS device, first, as a support wafer, a wafer having a desired cavity formed on a mirror surface side thereof and an oxide film then formed thereon is prepared. Then, the mirror surface of the support wafer having the cavity and the oxide film formed thereon is bonded, as a bonding surface, to a mirror surface of an active layer wafer.

Then, by carrying out bonding reinforcing heat treatment and grinding and polishing the active layer wafer similarly to the case disclosed in Japanese Patent Application Laid-open No. 2001-44398, a cavity SOI wafer having a SOI layer of a predetermined thickness and having a cavity formed therein may be obtained. In this case, by carrying out the bonding in a chamber under pressure control, the internal pressure of the cavity may be set at a desired value.

On the other hand, as a semiconductor device becomes finer and more highly integrated, the effect of metal impurities remaining on a wafer on characteristics and reliability of the device becomes greater. FIG. 9 is a sectional view illustrating a conventional SOI wafer. With reference to FIG. 9, in a SOI wafer in which a support wafer 51 and an active layer 52 formed by grinding and polishing an active layer wafer are bonded together with an oxide film 53 therebetween, metal impurities 54 remain at a bonding interface.

As a method of gettering metal impurities in a bonded SOI wafer, conventionally, for example, there is known a method in which a gettering layer is provided at the bonding interface (see, for example, Japanese Patent Translation Publication No. 2007/072624 and Japanese Patent Application Laid-open No. 2008-28244).

In the method disclosed in Japanese Patent Translation Publication No. 2007/072624, in a bonding reinforcing heat treatment step after the support wafer and the active layer wafer are bonded together, after at least heat treatment at a temperature in the range of 950 to 1,100° C. is carried out, by carrying out heat treatment at a temperature higher than 1,100° C., the bonding interface is caused to have a high gettering ability. However, the detailed reason that the bonding interface obtains the gettering ability by carrying out such two-stage heat treatment is not disclosed.

Further, in the method disclosed in Japanese Patent Application Laid-open No. 2008-28244, by carrying out the bonding under a state in which organic matter exists on a surface of a wafer before the bonding and carrying out bonding reinforcing heat treatment under a state in which the organic matter is confined at the bonding interface, minute crystal defects are formed at the bonding interface, and the crystal defects getter the metal impurities.

Note that, the crystal defects are minute crystal defects stemming from carbon produced by degradation of the organic matter. Further, the existence of carbon at the bonding interface may be analyzed by secondary ion mass spectrometry (SIMS), and the existence of carbon at a bonding surface may be analyzed by gas chromatograph-mass spectrometry (GC-MS) or the like.

However, the conventional technologies have the following problems.

The gettering method as disclosed in the above-mentioned Japanese Patent Translation Publication No. 2007/072624 and Japanese Patent Application Laid-open No. 2008-28244 cannot be used for a cavity SOI wafer having a cavity formed therein and a MEMS device using a cavity SOI wafer.

The reason for this is, in such a cavity SOI wafer and a MEMS device using a cavity SOI wafer, after the cavity SOI wafer is formed, for the purpose of forming a desired circuit element, high temperature heat treatment at 1,000° C. or higher is required a plurality of times.

Therefore, there is a problem that, even when gettering is carried out once, if metal impurities remain inside, the metal impurities diffuse again to lower the reliability of the cavity SOI wafer and the MEMS device using a cavity SOI wafer.

Further, there is a problem that rediffusion of the metal impurities may contaminate a manufacturing system. Further, because of the cavity, there is a problem that the thinned active layer may be broken, which results in a serious situation that the metal impurities attach to the manufacturing system or other products.

SUMMARY OF THE INVENTION

The present invention has been made to solve the above-mentioned problems, and an object of the present invention is to obtain a SOI wafer having an excellent ability of gettering metal impurities, an efficient method of manufacturing a SOI wafer, and a highly reliable MEMS device using such a SOI wafer.

According to an exemplary embodiment of the present invention, there is provided a SOI wafer including: two silicon wafers bonded together with an oxide film therebetween; a cavity formed in a bonding surface of at least one of the two silicon wafers; and a gettering material formed on a surface on a side opposite to the bonding surface.

According to an exemplary embodiment of the present invention, there is provided a method of manufacturing a SOI wafer including a support wafer and an active layer wafer which are bonded together with an oxide film therebetween, each of the support wafer and the active layer wafer being a silicon wafer, the method including: forming a cavity in a first surface of the support wafer, the first surface being a bonding surface of the SOI wafer; forming a gettering material on a surface of one of the support wafer and the active layer wafer on a side opposite to the first surface; carrying out thermal oxidation of one of the support wafer and the active layer wafer; bonding together the first surface of the support wafer and the active layer wafer; and carrying out bonding reinforcing heat treatment with respect to the support wafer and the active layer wafer which are bonded together.

According to an exemplary embodiment of the present invention, there is provided a MEMS device including: the above-mentioned SOI wafer according to the present invention; a diaphragm formed by grinding a silicon wafer on a side opposed to the cavity; and a distortion detecting unit formed on the diaphragm.

According to the exemplary embodiment of the present invention, the SOI wafer includes: the two silicon wafers bonded together with the oxide film therebetween; the cavity formed in the bonding surface of at least one of the two silicon wafers; and the gettering material formed on the surface on the side opposite to the bonding surface.

Further, according to the exemplary embodiment of the present invention, the method of manufacturing the SOI wafer including the support wafer and the active layer wafer which are bonded together with the oxide film therebetween, each of the support wafer and the active layer wafer being a silicon wafer, includes: forming the cavity in the first surface of the support wafer, the first surface being the bonding surface of the SOI wafer; forming the gettering material on the surface of one of the support wafer and the active layer wafer on the side opposite to the first surface; carrying out thermal oxidation of one of the support wafer and the active layer wafer; bonding together the first surface of the support wafer and the active layer wafer; and carrying out bonding reinforcing heat treatment with respect to the support wafer and the active layer wafer which are bonded together.

Further, according to the exemplary embodiment of the present invention, the MEMS device includes: the above-mentioned SOI wafer according to the present invention; a diaphragm formed by grinding the silicon wafer on the side opposed to the cavity; and a distortion detecting unit formed on the diaphragm.

Thus, the SOI wafer having an excellent ability of gettering the metal impurities, the efficient method of manufacturing a SOI wafer, and the highly reliable MEMS device using such a SOI wafer can be obtained.

BRIEF DESCRIPTION OF THE DRAWINGS

In the accompanying drawings:

FIG. 4 is a table showing the result of analysis by ICP-MS of metal impurities in a support wafer having a cavity formed therein with respect to the SOI wafer according to the second embodiment of the present invention;

FIG. 5 is a table showing the result of analysis by ICP-MS of metal impurities in the SOI wafer according to the second embodiment of the present invention;

DETAILED DESCRIPTION OF THE PREFERRED EMBODIMENTS

Figure 1:
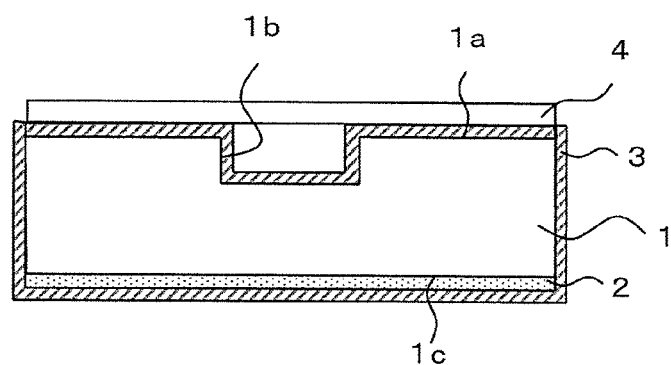
FIG. 1 is a sectional view illustrating a SOI wafer according to a first embodiment of the present invention.

In view of the above-mentioned problems, the inventors of the present invention have found that, as the result of their diligent research, with respect to a cavity SOI wafer having a cavity formed therein, particularly, contamination with metal impurities such as Na, Ni, Cu, and Fe occurs in a step of forming the cavity in a support wafer and in a bonding reinforcing heat treatment step between the support wafer and an active layer wafer.

Further, the inventors of the present invention have found that, by forming in advance a gettering material on the support wafer side, in the bonding reinforcing heat treatment step between the support wafer and the active layer wafer, metal impurities represented by Na, Ni, Cu, Fe, and the like may be trapped not at a bonding interface but in the gettering material.

The inventors of the present invention have then further found that, by removing these metal impurities together with the gettering material by grinding and polishing, a defect-free bonded cavity SOI wafer may be manufactured to complete the present invention.

Preferred embodiments of a SOI wafer, a manufacturing method therefor, and a MEMS device according to the present invention are described in the following with reference to the attached drawings. Note that, like reference numerals are used to designate like or corresponding members throughout the drawings.

First Embodiment

FIG. 1 is a sectional view illustrating a SOI wafer according to a first embodiment of the present invention. In FIG. 1, a support wafer 1 is a monocrystalline silicon wafer, and is a silicon wafer grown by, for example, the Czochralski (CZ) process. The conductivity type, the electrical characteristics including specific resistivity, the crystal orientation, and the like of the support wafer 1 are appropriately selected depending on the design values, the processes, and the like of the SOI wafer according to the present invention and of a device using the SOI wafer.

Further, at least one surface 1a of the support wafer 1 is mirror polished, and has a cavity 1b formed therein. The cavity 1b is formed by etching based on a resist pattern formed by photolithography, and the shape of the cavity 1b is appropriately selected depending on the device using the SOI wafer according to the present invention. For example, in the case of a pressure sensor, the cavity is formed into the shape of a square having a side of 300 to 500 μm and has a depth of about 5 to 20 μm.

Further, a gettering material 2 is formed on a surface 1c which is on a side opposite to the surface 1a having the cavity 1b formed therein. As the gettering material 2, from the viewpoint of the gettering ability, the simplicity of the forming method, and the like, a crushed layer formed by, for example, back grinding, sandblasting, or laser application, a polysilicon thin film, or the like is suitable. Further, an oxide film 3 is formed on surfaces of the support wafer 1 by, for example, thermal oxidation.

On the other hand, an active layer 4 which is, similarly to the support wafer 1, a silicon wafer grown by the CZ process is bonded to the mirror polished surface 1a of the support wafer 1 having the cavity 1b formed therein, and is thinned by grinding and polishing. The thickness of the active layer 4 is, in the case of, for example, a pressure sensor, about 5 to 30 μm. Further, the conductivity type, the specific resistivity, the crystal orientation, and the like of the active layer 4 are, similarly to the case of the support wafer 1, appropriately selected depending on the design values, the processes, and the like of the SOI wafer according to the present invention and of a device using the SOI wafer.

Figure 2:
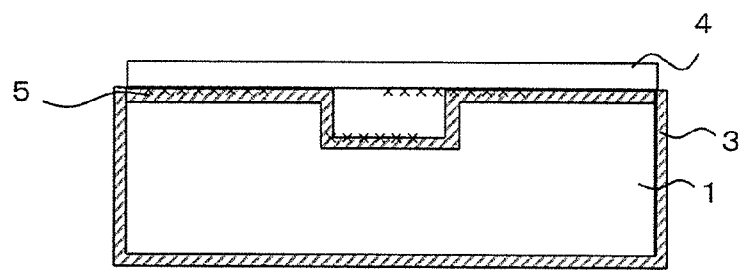
FIG. 2 is a sectional view illustrating a conventional SOI wafer having a cavity at a bonding interface.

In such a SOI wafer having the cavity 1b at a bonding interface, as illustrated in FIG. 2, particularly, metal impurities 5 such as Na, Ni, Cu, and Fe segregate at the bonding interface.

The metal impurities 5 are impurities attached to the bonding interface when the cavity 1b is formed, impurities which inherently remain as impurities in the silicon wafer, impurities which are unintentionally introduced from the outside in the process of manufacturing the SOI wafer, and the like, and are assumed to segregate because minute crystal defects generated at the bonding interface in a step of forming the cavity 1b and remaining distortion caused by the existence of the cavity 1b at the bonding interface become gettering sites.

In relation to this, by intentionally forming a crushed layer formed by, for example, grinding, sandblasting, or laser application, a polysilicon thin film, or the like on the surface 1c of the support wafer 1 which is on the side opposite to the surface 1a having the cavity 1b formed therein as the gettering material 2, the metal impurities 5 which segregate at the bonding interface are trapped in the gettering material 2.

As described above, according to the first embodiment, the SOI wafer includes two silicon wafers bonded together with an oxide film therebetween, a cavity formed in a bonding surface of at least one of the two silicon wafers, and a gettering material formed on a surface on a side opposite to the bonding surface.

Even when high temperature treatment is carried out in the process of manufacturing a device using the cavity SOI wafer, the gettering material is covered with the oxide film, and thus, the metal impurities trapped in the gettering material may be prevented from passing through the oxide film to diffuse to the outside because the diffusion rate in the oxide film is extremely low.

Accordingly, a SOI wafer having an excellent gettering ability with respect to metal impurities may be obtained.

Second Embodiment

A method of manufacturing a SOI wafer according to a second embodiment of the present invention is described with reference to the explanatory views of FIGS. 3A to 3G.

First, two silicon wafers formed as slices of a monocrystalline silicon ingot grown by the Czochralski (CZ) process are prepared. Note that, the conductivity type and the specific resistivity of the silicon wafers meet intended specifications according to the device using the SOI wafer. After that, at least one surface of each of these silicon wafers is mirror polished using a publicly known wafer polishing process to form the support wafer 1 and an active layer wafer 6.

Figure 3:
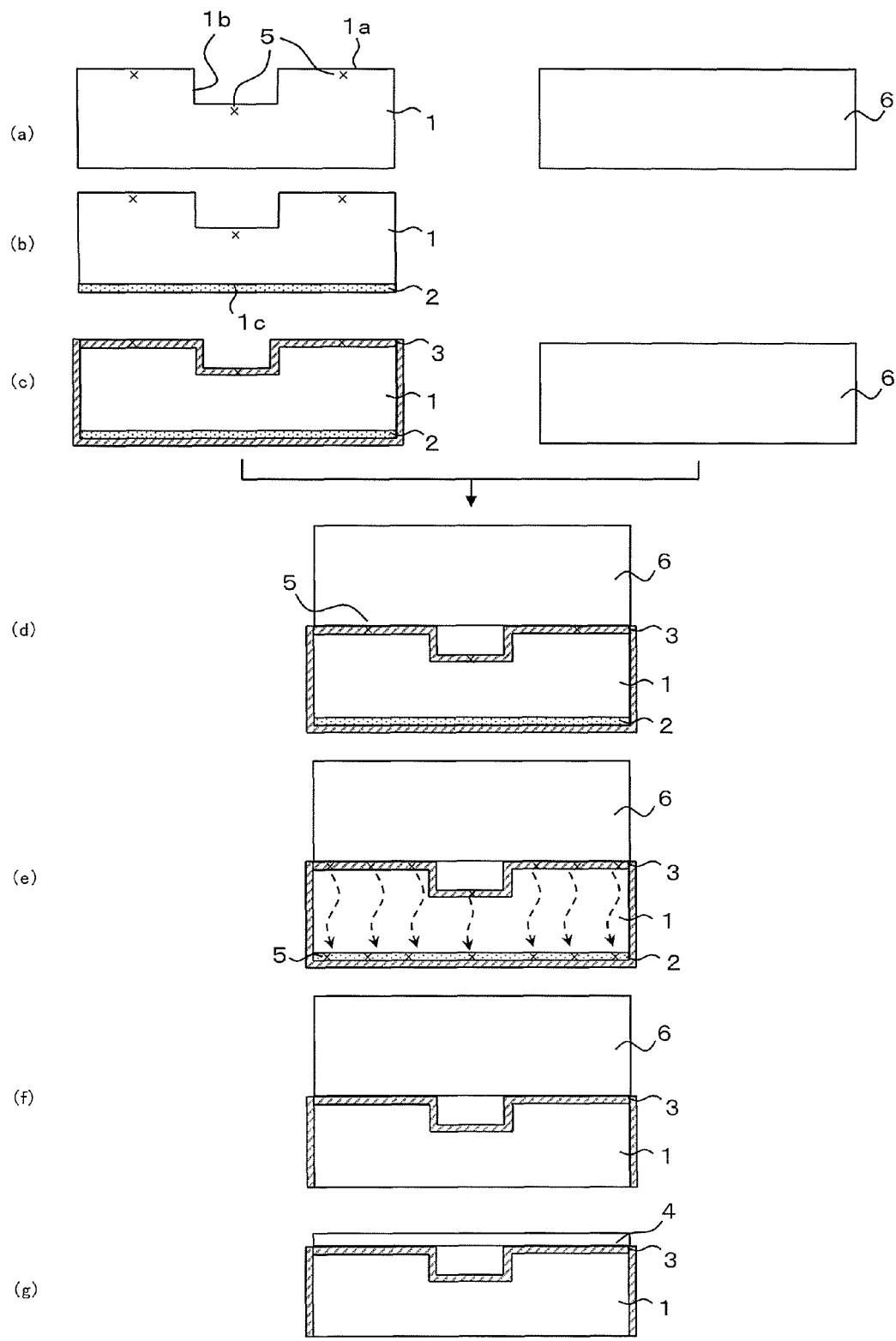
FIGS. 3A to 3G are explanatory views illustrating a method of manufacturing a SOI wafer according to a second embodiment of the present invention.

Then, the cavity 1b is formed in the mirror polished surface 1a (first surface) of the support wafer 1 using publicly known photolithography and etching (see FIG. 3A). For example, in regards to the etching, depending on required specifications regarding to the etching depth and the pattern accuracy, anisotropic wet etching using an alkaline etchant and dry etching such as deep RIE may be selectively used.

In this case, even when the photolithography system and the etching system are under contamination control, it is theoretically difficult to completely avoid contamination with metal impurities of the processed mirror polished surface 1a, and a certain amount of the metal impurities 5 attach to the mirror polished surface 1a.

For example, the mirror polished surface 1a having the cavity 1b formed therein is etched using HF by one micrometers from the outermost surface. The etchant is collected every time the one-micrometer etching is carried out, and is analyzed using inductively coupled plasma-mass spectrometry (ICP-MS). An exemplary result of the analysis is shown in FIG. 4.

With reference to FIG. 4, all the metal impurities in the exemplary result exhibit concentrations higher than those in the case in which the cavity 1b is not formed. The Cu concentration is particularly high, which is assumed to be related to the dry etching system used in forming the cavity.

Then, the gettering material 2 is formed on the surface 1c which is on the side opposite to the surface 1a having the cavity 1b formed therein (see FIG. 3B). As the gettering material 2, a crushed layer, a polysilicon thin film, or the like is suitable. Note that, the crushed layer may be formed in various ways, but, from the viewpoint of forming more easily crystal defects having a high gettering ability, a method such as grinding, sandblasting, or laser application may be used.

Then, the oxide film 3 to be a BOX layer is formed on surfaces of the support wafer 1 (see FIG. 3C). In this case, as the method of forming the oxide film 3, thermal oxidation is suitable. The thickness of the oxide film 3 is about 0.1 to 2 μm partly depending on the application thereof.

Then, after the support wafer 1 and the active layer wafer 6 are cleaned, rinsed, and dried, the mirror polished surface of the active layer wafer 6 to be the active layer 4 for forming a semiconductor element and the mirror polished surface 1a of the support wafer 1 are brought into intimate contact with each other and bonded together at room temperature with the oxide film 3 therebetween (see FIG. 3D).

Then, in order to reinforce the bonding power between the support wafer 1 and the active layer wafer 6, the bonding reinforcing heat treatment is carried out (see FIG. 3E). In this case, typical heat treatment conditions are set to 1,100° C. for two hours, and the atmospheric gas is ordinarily oxygen. Note that, the bonding power obtained is known to become higher as the temperature becomes higher and as the treatment time period becomes longer, but, as a trade-off with the cost and the throughput, the above-mentioned conditions are optimum.

Figure 9:
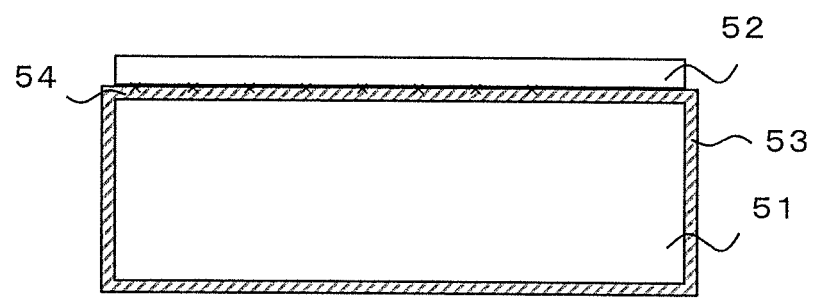
FIG. 9 is a sectional view illustrating a conventional SOI wafer.

In a bonded SOI wafer, it is known that, generally, in the bonding reinforcing heat treatment step, metal impurities which are inherently contained in the crystals of the support wafer and the active layer wafer, metal impurities contained in the atmosphere introduced in the heat treatment furnace, and metal impurities introduced in an inner wall of a furnace tube or the like segregate to minute crystal defects remaining at the bonding interface (see above-mentioned FIG. 9).

Further, in a SOI wafer having the cavity 1b at the bonding interface thereof, as described above, it is difficult to completely avoid contamination with metal at the bonding interface in the step of forming the cavity 1b, and a certain amount of the metal impurities 5 are introduced. Specifically, in a SOI wafer having the cavity 1b at the bonding interface thereof, compared with the case of an ordinary SOI wafer without a cavity, the metal impurities 5 at a higher concentration segregate at the bonding interface (see above-mentioned FIG. 2).

FIG. 5 shows an example of the results of analysis of the concentrations of the metal impurities, using ICP-MS with respect to etchants collected every time when the active layer 4 of the SOI wafer, having an actual structure in section illustrated in FIG. 2, is subjected to etching from the surface side. Note that, the thickness of the active layer 4 of the SOI wafer used in the analysis is 10 μm. It follows that the depth from the outermost surface to the bonding interface is 10 μm.

Further, taking the etching accuracy into consideration, the concentration is determined separately with respect to a portion from the outermost surface to the depth of 8 μm and with respect to a portion from the depth of 8 μm to the depth of 12 μm so that the analysis may be conducted separately with regard a portion including the bonding interface and with respect to a portion not including the bonding interface.

With reference to FIG. 5, the concentrations of all the metal elements are higher by an order of magnitude or more than those in the case of the support wafer 1 shown in FIG. 4. The concentration of Ni is particularly high. No matter how much the metal impurities are trapped at the bonding interface, such a high concentration is by no means allowable taking into consideration rediffusion due to heat treatment in the step of forming the device after that and possible contamination with metal on the manufacturing system side when the thinned active layer 4 is broken.

Accordingly, in order to solve such a problem, the gettering material 2 formed on the surface 1c which is on the side opposite to the surface 1a of the support wafer 1 having the cavity 1b formed therein exerts its effect in this bonding reinforcing heat treatment step. Specifically, both the metal impurities 5 which are inherently contained in the support wafer 1 or the active layer wafer 6 and the metal impurities 5 which are introduced from the outside in the bonding reinforcing heat treatment step are trapped in the gettering material 2 (see FIG. 3E). After that, inspection of whether or not there is a void at the bonding interface is made using an ultrasonic scanning microscope or the like.

Then, by grinding the support wafer 1 side of the bonded SOI wafer, the trapped metal impurities 5 are removed together with the gettering material 2 (see FIG. 3F).

Then, after an edge processing step of removing an outer peripheral side of the active layer wafer 6 and the like, finally, the active layer wafer 6 is ground to be thinned to a desired thickness, and then, the active layer wafer 6 is polished to be mirror finished to form the active layer 4 (see FIG. 3G).

As described above, according to the second embodiment, the method of manufacturing a SOI wafer including a support wafer and an active layer wafer which are bonded together with an oxide film therebetween, each of the support wafer and the active layer wafer being a silicon wafer, includes: forming a cavity in a first surface of the support wafer, the first surface being a bonding surface of the SOI wafer; forming a gettering material on a surface of one of the support wafer and the active layer wafer on a side opposite to the first surface; carrying out thermal oxidation of one of the support wafer and the active layer wafer; bonding together the first surface of the support wafer and the active layer wafer; and carrying out bonding reinforcing heat treatment with respect to the support wafer and the active layer wafer which are bonded together.

This method enables, in the process of manufacturing the cavity SOI wafer, removal of the metal impurities trapped in the gettering material together with the gettering material, and thus, a highly reliable cavity SOI wafer which does not contain metal impurities may be obtained.

Further, in the process of manufacturing a device using the cavity SOI wafer, even when the thinned active layer is broken, the metal impurities do not remain, and thus, a situation that the manufacturing system is contaminated with metal impurities may be prevented from occurring.

Further, an efficient method of manufacturing a SOI wafer may be obtained.

Third Embodiment

A method of manufacturing a SOI wafer according to a third embodiment of the present invention is described with reference to the explanatory views of FIGS. 6A to 6E.

First, a monocrystalline silicon wafer having at least one mirror polished surface is prepared as the support wafer 1. Further, a monocrystalline silicon wafer having both mirror polished surfaces is prepared as the active layer wafer 6.

Figure 6:
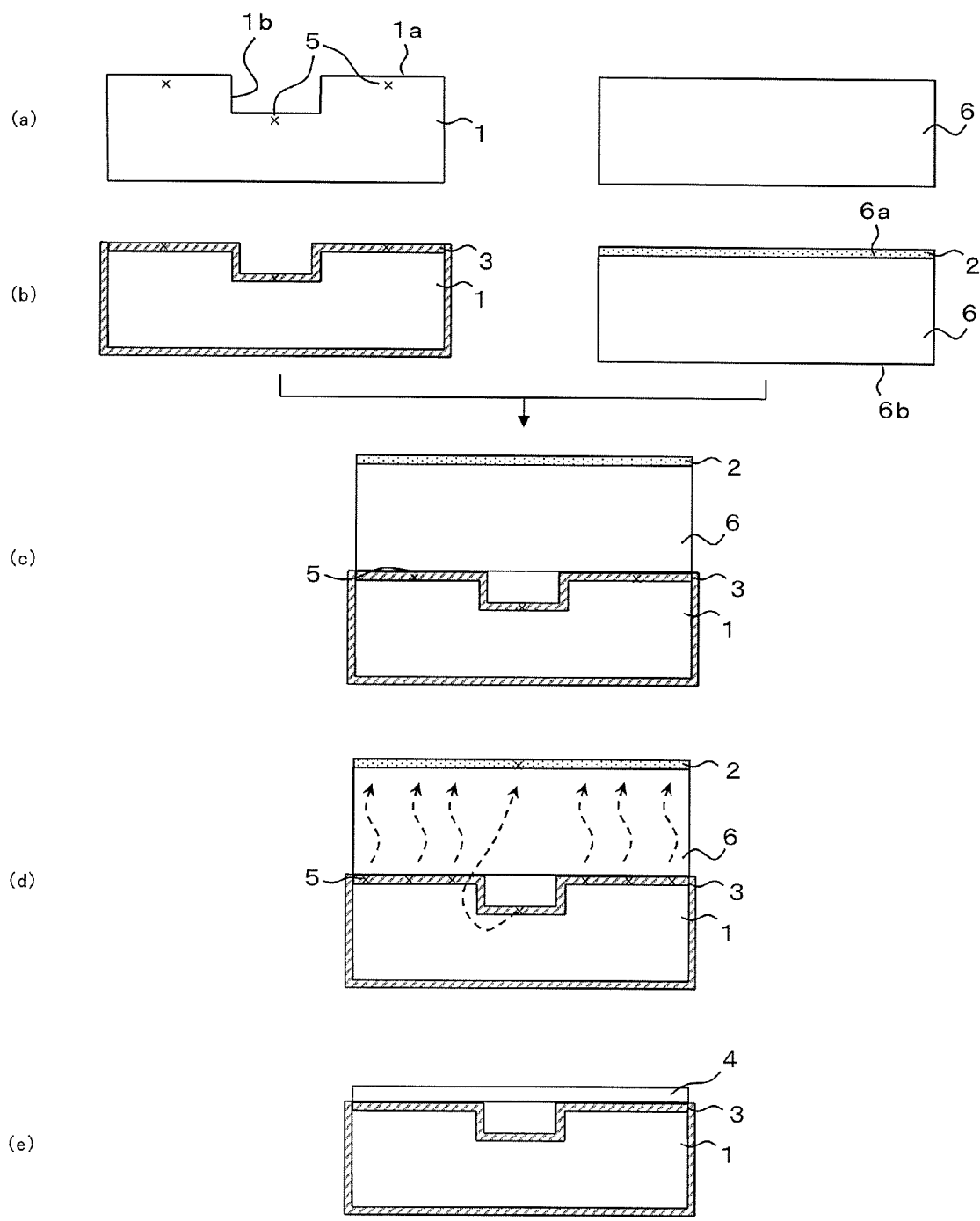
FIGS. 6A to 6E are explanatory views illustrating a method of manufacturing a SOI wafer according to a third embodiment of the present invention.

Then, similarly to the case of the above-mentioned second embodiment, the cavity 1b is formed in the mirror polished surface 1a of the support wafer 1 using publicly known photolithography and etching (see FIG. 6A).

In this case, similarly to the case of the above-mentioned second embodiment, it is theoretically difficult to completely avoid contamination with metal impurities of the mirror polished surface 1a of the support wafer 1 having the cavity 1b formed therein, and the metal impurities 5 attach to the mirror polished surface 1a although the amount thereof is extremely small.

Then, the oxide film 3 to be a BOX layer is formed on surfaces of the support wafer 1 by thermal oxidation or the like, and the gettering material 2 is formed on one surface 6a of the active layer wafer 6 (see FIG. 6B).

Then, after the support wafer 1 and the active layer wafer 6 are cleaned, rinsed, and dried, the mirror polished surface 1a of the support wafer 1 having the cavity 1b formed therein and a mirror polished surface 6b of the active layer wafer 6 on a side on which the gettering material 2 is not formed to be the active layer 4 for forming a semiconductor element are brought into intimate contact with each other and bonded together at room temperature with the oxide film 3 therebetween (see FIG. 6C).

Then, in order to reinforce the bonding power between the support wafer 1 and the active layer wafer 6, the bonding reinforcing heat treatment is carried out (see FIG. 6D). In this case, typical heat treatment conditions are set to 1,100° C. for two hours, and the atmospheric gas is ordinarily oxygen.

In this case, the gettering material 2 is formed on the active layer wafer 6, and thus, the metal impurities 5 attaching to the mirror polished surface 1a of the support wafer 1 having the cavity 1b formed therein, the metal impurities 5 which inherently remain in the active layer wafer 6, and the metal impurities 5 introduced from the outside such as the furnace in the bonding reinforcing heat treatment step diffuse without segregating at the bonding interface to be trapped in the gettering material 2. After that, inspection of whether or not there is a void at the bonding interface is made using an ultrasonic scanning microscope or the like.

Then, after the edge processing step of removing the outer peripheral side of the active layer wafer 6 and the like, finally, the active layer wafer 6 is ground to be thinned to a desired thickness, and then, the active layer wafer 6 is polished to be mirror finished to form the active layer 4 (see FIG. 6E). This step removes the metal impurities 5 together with the gettering material 2 which traps the metal impurities 5.

As described above, according to the third embodiment, effects similar to those of the above-mentioned second embodiment may be obtained.

Fourth Embodiment

A method of manufacturing a SOI wafer according to a fourth embodiment of the present invention is described with reference to the explanatory views of FIGS. 7A to 7F.

First, a monocrystalline silicon wafer having at least one mirror polished surface is prepared as the support wafer 1. Further, a monocrystalline silicon wafer having both mirror polished surfaces is prepared as the active layer wafer 6.

Figure 7:
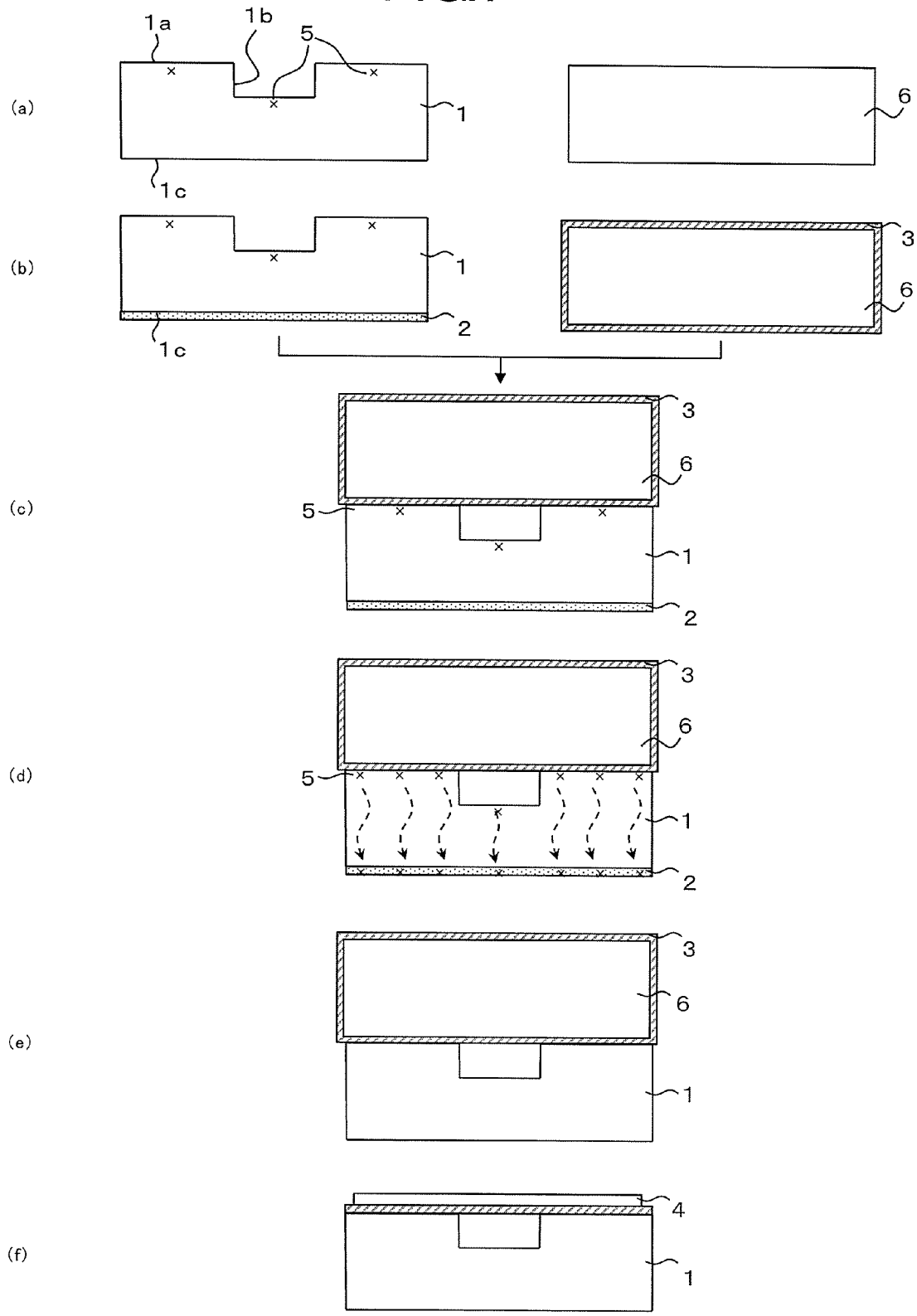
FIGS. 7A to 7F are explanatory views illustrating a method of manufacturing a SOI wafer according to a fourth embodiment of the present invention.

Then, similarly to the case of the above-mentioned second embodiment, the cavity 1b is formed in the mirror polished surface 1a of the support wafer 1 using publicly known photolithography and etching (see FIG. 7A).

Then, the gettering material 2 is formed on the surface 1c which is on the side opposite to the mirror polished surface 1a of the support wafer 1 having the cavity 1b formed therein. In parallel with this, the oxide film 3 to be a BOX layer is formed on surfaces of the active layer wafer 6 by thermal oxidation or the like (see FIG. 7B).

Next, after the support wafer 1 and the active layer wafer 6 are cleaned, rinsed, and dried, the mirror polished surface 1a of the support wafer 1 having the cavity 1b formed therein and the active layer wafer 6 to be the active layer 4 for forming a semiconductor element are brought into intimate contact with each other and bonded together at room temperature with the oxide film 3 therebetween (see FIG. 7C).

Then, in order to reinforce the bonding power between the support wafer 1 and the active layer wafer 6, the bonding reinforcing heat treatment is carried out (see FIG. 7D). In this case, typical heat treatment conditions are set to 1,100° C. for two hours, and the atmospheric gas is ordinarily oxygen.

In this case, the gettering material 2 is formed on the support wafer 1, and thus, the metal impurities 5 attaching to the mirror polished surface 1a of the support wafer 1 having the cavity 1b formed therein, the metal impurities 5 which inherently remain in the support wafer 1, and the metal impurities 5 introduced from the outside such as the furnace in the bonding reinforcing heat treatment step diffuse without segregating at the bonding interface to be trapped in the gettering material 2. After that, inspection of whether or not there is a void at the bonding interface is made using an ultrasonic scanning microscope or the like.

Then, by grinding the surface of the support wafer 1 on the side on which the cavity 1b is not formed, the trapped metal impurities 5 are removed together with the gettering material 2 (see FIG. 7E).

Then, after the edge processing step of removing the outer peripheral side of the active layer wafer 6 and the like, finally, the active layer wafer 6 is ground to be thinned to a desired thickness, and then, the active layer wafer 6 is polished to be mirror finished to form the active layer 4 (see FIG. 7F).

As described above, according to the fourth embodiment, effects similar to those of the above-mentioned second embodiment may be obtained.

Fifth Embodiment

Figure 8:
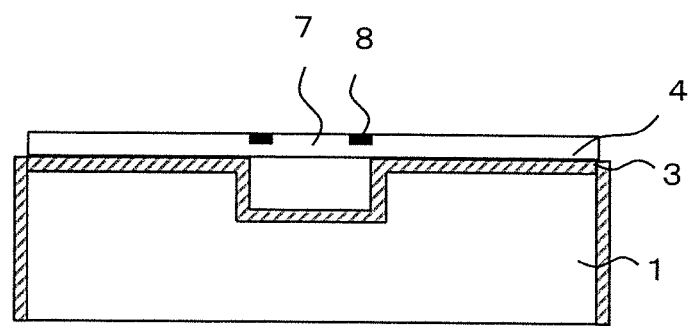
FIG. 8 is a sectional view illustrating a MEMS device according to a fifth embodiment of the present invention.

A MEMS device according to a fifth embodiment of the present invention is described with reference to the sectional view of FIG. 8. In FIG. 8, a semiconductor pressure sensor is illustrated as an example of the MEMS device.

First, for example, the cavity SOI wafer described in the above-mentioned second embodiment is prepared (see FIGS. 3A to 3G). In particular, in order to use the cavity SOI wafer for a pressure sensor, in a step illustrated in FIG. 3D, the support wafer 1 and the active layer wafer 6 are bonded together under a vacuum environment. This enables the inside of the cavity 1b to a vacuum state to function as a reference pressure chamber.

Further, as described above, the cavity 1b is formed into the shape of a square having a side of 300 to 500 μm and has a depth of about 5 to 20 μm. Further, in a step illustrated in FIG. 3G, the active layer 4 is thinned according to the pressure range to be measured. For example, when the pressure range is 5 atmospheres or less, the thickness of the active layer 4 is appropriately selected in the range of 5 to 30 μm. This enables the active layer 4 to function as a diaphragm 7 which deflects according to pressure applied thereto from the outside.

Further, by carrying out ion implantation and heat treatment with respect to the diaphragm 7 of the cavity SOI wafer prepared in this way, a piezoelectric resistance 8 is formed. This enables applied pressure to be detected as stress generated in the diaphragm 7.

When the metal impurities 5 remain in the cavity SOI wafer used for manufacturing the device, the metal impurities 5 remain in the pressure sensor as an end product to considerably lower the reliability thereof. Further, in a step of forming a distortion detecting unit such as the piezoelectric resistance 8 which requires high temperature heat treatment of 1,000° C. or higher, the remaining metal impurities 5 may diffuse to contaminate the manufacturing system or other products, which is a serious situation. By using the SOI wafer according to the present invention, the metal impurities 5 may be trapped and removed in advance by the gettering material 2.

As described above, according to the fifth embodiment, the MEMS device includes the above-mentioned SOI wafer according to the present invention, a diaphragm formed by grinding a silicon wafer on a side opposed to the cavity, and a distortion detecting unit formed on the diaphragm.

Therefore, a MEMS device which uses such a SOI wafer and which is highly reliable may be obtained.

What is claimed is:

1. A silicon on insulator (SOI) wafer, comprising:
   a first silicon wafer and a second silicon wafer which are bonded together with an oxide film therebetween;
   a cavity formed on a bonding surface of the first silicon wafer; and
   a gettering material that is formed on a surface of the first silicon wafer on a side opposite to the bonding surface.

2. The SOI wafer according to claim 1, wherein the gettering material comprises a crushed layer.

3. The SOI wafer according to claim 1, wherein the gettering material comprises a polysilicon thin film.

4. A MEMS device comprising:
   the SOI wafer according to claim 1;
   a diaphragm formed by grinding a silicon wafer on the side opposed to the cavity; and
   a distortion detecting unit formed on the diaphragm.

5. The MEMS device according to claim 4, wherein the distortion detecting unit comprises a piezoelectric resistance.

6. The SOI wafer according to claim 1, wherein metal impurities attached to the bonding surface move toward the gettering material through the first silicon wafer.

7. A silicon on insulator (SOI) wafer, comprising:
   a first silicon wafer and a second silicon wafer which are bonded together with an oxide film therebetween;

a cavity formed on a bonding surface of the first silicon wafer; and a gettering material that is formed on a surface of the second silicon wafer on a side opposite to the bonding surface of the first silicon wafer and absorbs metal impurities attached to the bonding surface.

8. The SOI wafer according to claim 7, wherein the metal impurities move toward the gettering material through the second silicon wafer.

* * * * *